United States Patent
Chen et al.

(10) Patent No.: US 11,133,294 B2
(45) Date of Patent: Sep. 28, 2021

(54) TRANSPARENT DISPLAY PANEL

(71) Applicant: PLAYNITRIDE INC., Zhubei (TW)

(72) Inventors: Pei-Hsin Chen, Zhubei (TW); Yi-Chun Shih, Zhubei (TW); Yi-Ching Chen, Zhubei (TW); Ying-Tsang Liu, Zhubei (TW); Yu-Chu Li, Zhubei (TW)

(73) Assignee: PLAYNITRIDE INC., Hsinchu County (TW)

( * ) Notice: Subject to any disclaimer, the term of this patent is extended or adjusted under 35 U.S.C. 154(b) by 94 days.

(21) Appl. No.: 16/539,483

(22) Filed: Aug. 13, 2019

(65) Prior Publication Data

US 2020/0058625 A1 Feb. 20, 2020

(30) Foreign Application Priority Data

Aug. 15, 2018 (TW) .................................. 107128460

(51) Int. Cl.
*H01L 25/075* (2006.01)
*H01L 33/58* (2010.01)
*H01L 33/62* (2010.01)

(52) U.S. Cl.
CPC .......... *H01L 25/0753* (2013.01); *H01L 33/58* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 8,672,498 B2* | 3/2014 | Bae | G02B 6/0073 362/97.1 |
| 9,082,936 B2* | 7/2015 | Baldridge | H01L 25/0753 |
| 2008/0123711 A1* | 5/2008 | Chua | H01S 5/18391 372/50.11 |
| 2011/0163683 A1* | 7/2011 | Steele | F21V 7/06 315/192 |
| 2012/0037886 A1* | 2/2012 | Hsu | H01L 33/58 257/13 |
| 2016/0064613 A1* | 3/2016 | Chiu | H01L 33/385 257/13 |
| 2019/0384445 A1* | 12/2019 | Huang | G06F 3/0416 |

* cited by examiner

*Primary Examiner* — Michelle Mandala
(74) *Attorney, Agent, or Firm* — JCIPRNET

(57) ABSTRACT

A transparent display panel with a light-transmitting substrate, a plurality of top-emitting micro light emitting diodes, a plurality of bottom-emitting micro light emitting diodes, and a light shielding layer. The light transmissive substrate has a surface. These top-emitting micro light emitting diodes and these bottom-emitting micro light emitting diodes are disposed on the surface of the light transmissive substrate. The bottom-emitting micro light emitting diodes has an epitaxial structure and a light shielding member, the epitaxial structure has a pair of upper and lower surfaces on the opposite sides, the lower surface faces toward the light transmissive substrate, and the light shielding member is disposed on the upper surface to shield the light emitted by the bottom-emitting micro light emitting diodes towards the upper surface.

18 Claims, 6 Drawing Sheets

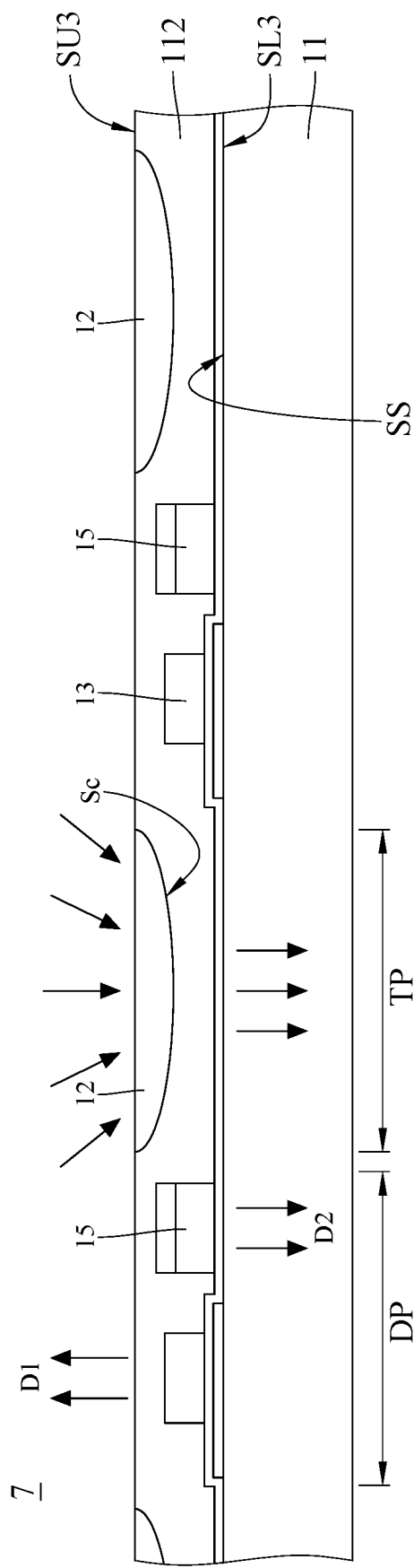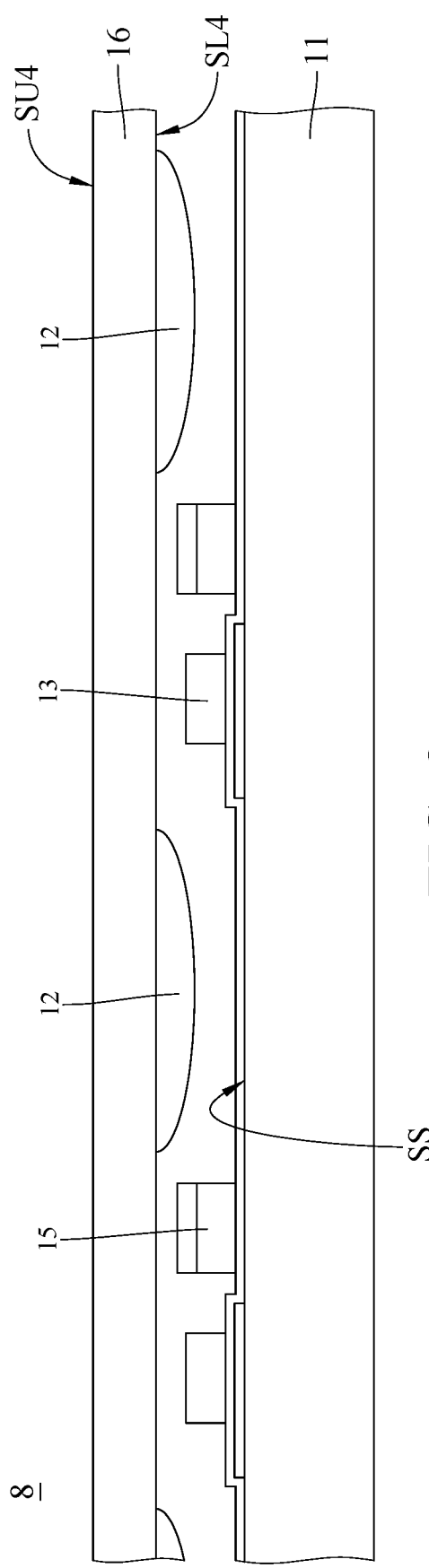

TRANSPARENT DISPLAY PANEL

CROSS-REFERENCE TO RELATED APPLICATIONS

This non-provisional application claims priority under 35 U.S.C. § 119(a) on Patent Application No(s).107128460 filed in Taiwan, R. O. C. on Aug. 15, 2018, the entire contents of which are hereby incorporated by reference.

BACKGROUND

Technical Field

The present disclosure is related to transparent display panel, and more particularly to a transparent display panel having a plurality of display surfaces.

Related Art

A transparent display panel generally refers to a display panel that a user can see an object behind it from a display surface. Furthermore, some applications of display panels need to provide a double-sided display function, that is, a display panel may have multiple display surfaces, and the user can see the multiple images provided by the display panel from the display surfaces respectively. The display panel with multiple images can be used such as window displays, conferences or signage.

However, as far as the current technology is concerned, the display panel with multiple images is combined two display panels. In the case of a display panel with double-sided display, the thickness and weight of the display module considerably huge, and the transparency may be limited, therefore the utility would be reduced.

SUMMARY

The present disclosure is to provide a transparent display panel, which reduces the overall thickness of the transparent display panel while providing multi-image display.

The present disclosure a transparent display panel. The transparent display panel has a light transmissive substrate, a plurality of top-emitting micro light emitting diodes, a plurality of bottom-emitting micro light emitting diodes and a light shielding layer. The light transmissive substrate has a surface. These top-emitting micro light emitting diodes are disposed on the surface of the light transmissive substrate. These bottom-emitting micro light emitting diodes are also disposed on the surface of the light transmissive substrate. Each of the micro light emitting diodes has an epitaxial structure and a light-shielding component, and the epitaxial structure has an upper surface and a lower surface on the opposite side, the lower surface faces toward the light transmissive substrate, and the light-shielding component is disposed on the upper surface to shield the light emitted by the bottom-emitting micro light emitting diodes toward the upper surface. The light shielding layer is disposed on the surface of the light transmissive substrate, and a portion of the light shielding layer is disposed between the top-emitting micro light emitting diode and the light transmissive substrate to shield light emitted from the top-emitting micro light emitting diodes toward the light transmissive substrate.

The above description of the disclosure and the following description of the embodiments of the present disclosure are intended to illustrate and explain the spirit and principles of the invention, and can give a further explain of the present disclosure.

BRIEF DESCRIPTION OF THE DRAWINGS

The present disclosure will become more fully understood from the detailed description given here in below and the accompanying drawings which are given by way of illustration only and thus are not limitative of the present disclosure and wherein:

FIG. 7 is a partial cross-sectional view showing a transparent display panel according to yet another embodiment of the present disclosure.

FIG. 8 is a partial cross-sectional view showing another embodiment of a transparent display panel according to yet another embodiment of the present disclosure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
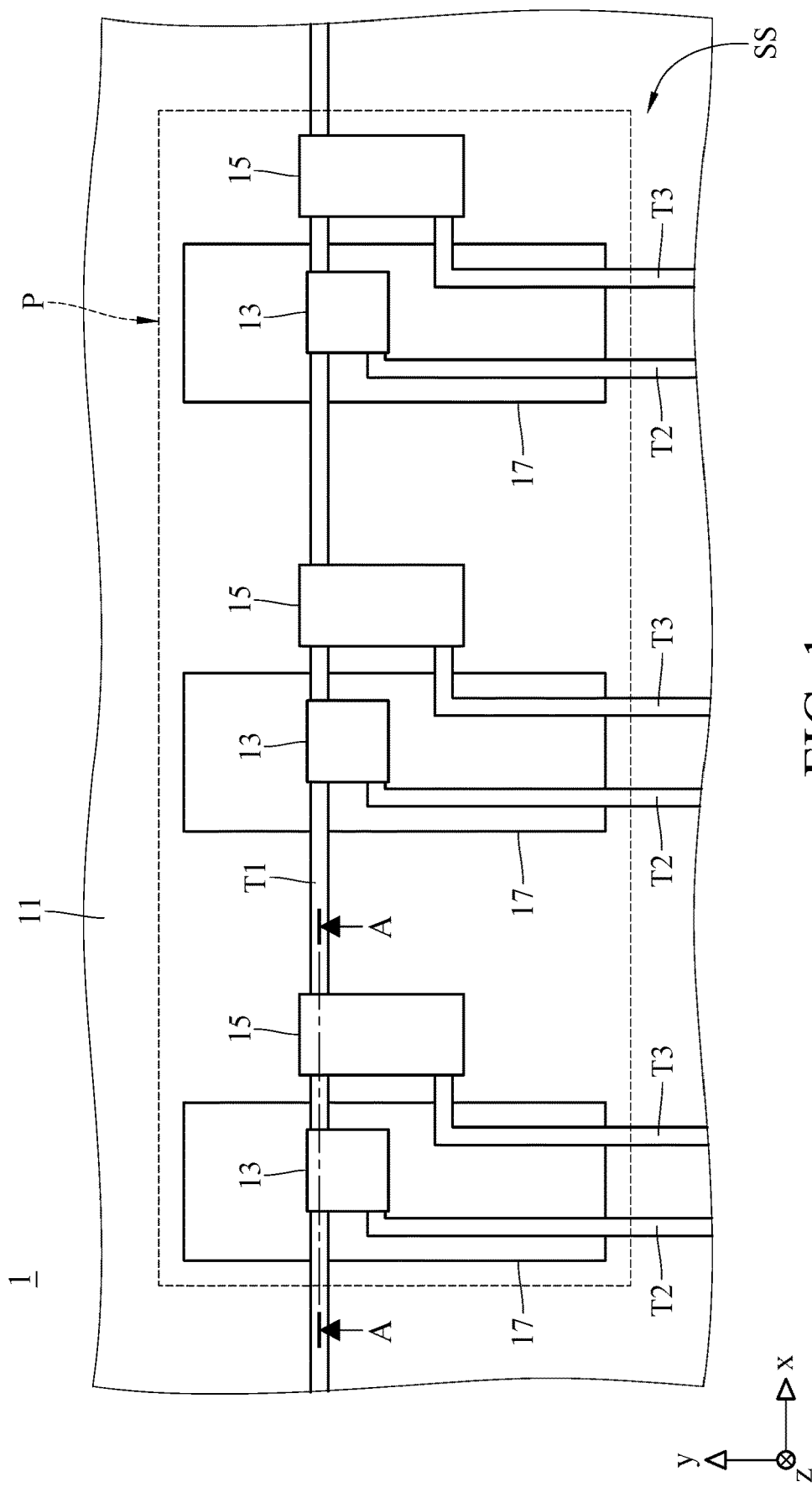
FIG. 1 is a partial top view of a transparent display panel according to an embodiment of the disclosure.

Please refer to FIG. 1. FIG. 1 is a partial top view of a transparent display panel according to an embodiment of the present disclosure. As shown in FIG. 1, the transparent display panel 1 has a light transmissive substrate 11, an top-emitting micro light emitting diode 13, a bottom-emitting micro light emitting diode 15, and a light shielding layer 17. The light transmissive substrate 11 has a surface SS. The top-emitting micro light emitting diode 13, the bottom-emitting micro light emitting diode 15, and the light shielding layer 17 are all disposed on the surface SS. A portion of the light shielding layer 17 is located between the top-emitting micro light emitting diode 13 and the surface SS. In more detail, the surface SS is further provided with control wires T1, T2, T3, the top-emitting micro light emitting diode 13 has two electrodes with different type, such as an N-type electrode and a P-type electrode, and the bottom-emitting micro light emitting diode 15 has two electrodes with different type. In this embodiment, the top-emitting micro light emitting diode 13 and the bottom-emitting micro light emitting diode 15 are electrically connected to the control wires T1, T2, and T3 via the electrodes. That is, by controlling the electric signals transmitted by the control wires T1, T2, and T3, light would be emitted by the top-emitting micro light emitting diode 13 and the bottom-emitting micro light emitting diode 15. In practice, the electrodes of the top-emitting micro light emitting diode 13 and the electrodes of the bottom-emitting micro light emitting diode 15 are electrically connected, for example, via bumps and fixed to the corresponding control wires T1, T2 and T3. In brief description, the electrodes of each micro light emitting diode and the bumps are omitted in FIG. 1. The orthographic projection of the light shielding layer 17 on the surface SS of the light transmissive substrate 11 covers the orthographic projection of the top-emitting micro light emitting diode 13 on the surface SS of the light transmissive substrate 11, and an area of the orthographic projection of the light shielding layer 17 is preferably larger than an area of the orthographic projection of the top-emitting micro light emitting diode 13. Moreover, the area of the orthographic projection of the top-emitting micro light emitting diode 13 disposes entirely in the area of the orthographic projection of the light shielding layer 17. In addition, the orthographic projection of the light shielding layer 17 on the surface SS of the light transmissive substrate 11 and the orthographic projection of the bottom-emitting micro light emitting diode 15 are separated from each other and have a distance between them, that is, the orthographic projection of the light shielding layer 17 and the orthographic projections of the bottom-emitting micro light emitting diodes 15 do not overlap each other. Further, the area of the orthographic projection of the bottom-emitting micro light emitting diode 15 on the surface SS of the light transmissive substrate 11 is larger than the total area of the orthographic projection of the upper light transmissive substrate 13 on the surface SS of the light transmissive substrate 11.

Figure 2:
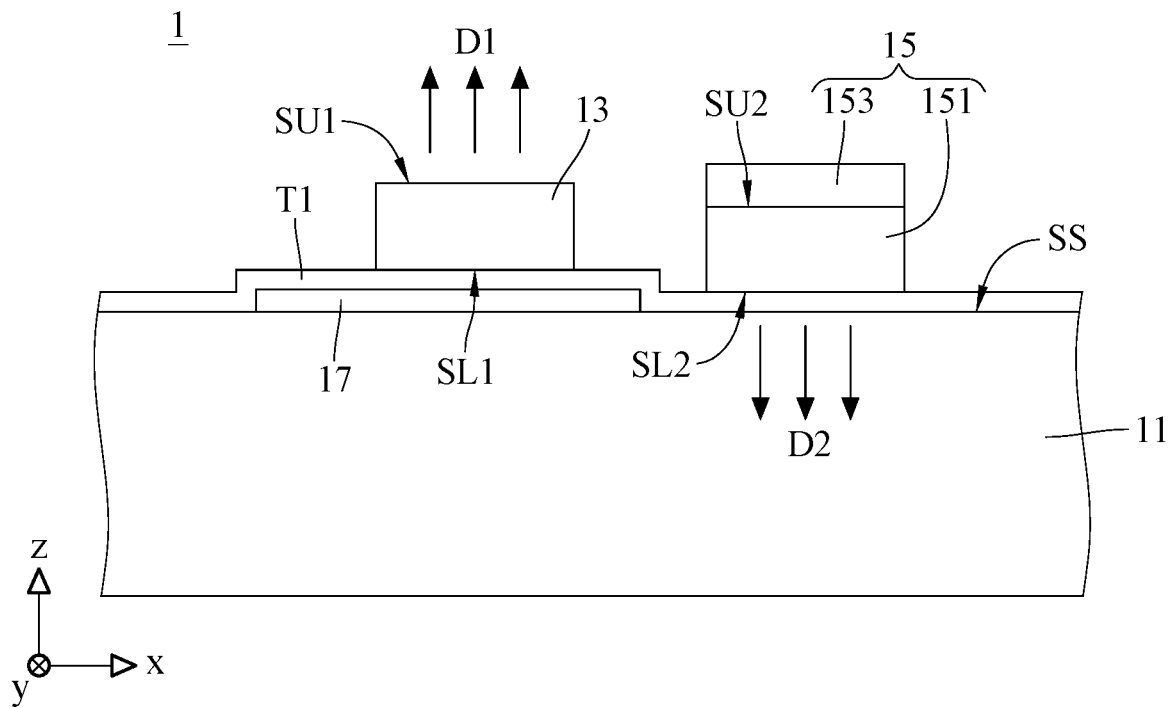
FIG. 2 is a cross-sectional view showing an embodiment of an AA cross section of the transparent display panel illustrated in FIG. 1 according to the present disclosure.

Referring to FIG. 1 and FIG. 2, FIG. 2 is a cross-sectional view showing the AA cross section of the transparent display panel 1 shown in FIG. 1 according to the present disclosure. In this embodiment, the top-emitting micro light emitting diodes 13 are electrically connected and fixed to the control wires T1 and T2 respectively, and the bottom-emitting micro light emitting diodes 15 are electrically connected and fixed to the control traces T1 and T3 respectively. The control wire T1 is, for example, a common electrode conductive layer for providing a reference voltage to the top-emitting micro light emitting diodes 13 and the bottom-emitting micro light emitting diodes 15, and the control wires T2 and T3 are respectively used to provide corresponding control voltage to control the driving current to the top-emitting micro light emitting diode 13 and the bottom-emitting micro light emitting diode 15. The transparent display panel 1 further has a plurality of pixels P. In the embodiment, each of the pixels P is provided with three top-emitting micro light emitting diodes 13 respectively emitting red, blue and green light, and three bottom-emitting micro light emitting diodes 15 respectively emitting red, blue and green light. That is, the top-emitting micro light emitting diodes 13 forms an image in the light-emitting direction D1, and the bottom-emitting micro light emitting diodes 15 forms another image in the light-emitting direction D2, and the resolution of the image in the light-emitting direction D1 is equivalent to the resolution of the image in the light-emitting direction D2. Furthermore, there is an image display surface in the light-emitting direction D1 for the viewer, and the top-emitting micro light emitting diodes 13 are light source for this image display surface, and there is another image display surface in light-emitting direction D2 for the viewer, and the bottom-emitting micro light emitting diodes 15 are light source for this image display surface. The images on the two image display surfaces can be the same or can also be controlled independently.

The top-emitting micro light emitting diode 13 has a upper surface SU1 and lower surface SL1 opposite the upper surface SU1. The lower surface SL1 faces the surface SS, and the light shielding layer 17 is located between the lower surface SL1 and the surface SS. In practice, the light shielding layer 17 may be an non-transparent layer, such as a black photoresist; or the light shielding layer 17 may be a reflective layer, such as a multilayer film (Bragg mirror), an organic coating, a metal, or something alike. The light shielding layer 17 can shield the light emitted from the top-emitting micro light emitting diode 13 in the negative z-axis direction. In the case of the light shielding layer 17 formed by reflective material, the light-shielding layer 17 can reflect the light which emitted from the top-emitting micro light emitting diode 13 towards the negative z-axis direction into toward the positive z-axis direction. Based on the above structure, the main light emitting direction of the top-emitting micro light emitting diodes 13 is the light emitting direction D1 (ie, the positive z-axis direction described above), and the light shielding layer 17 can reduce the light emitted by the top-emitting micro light emitting diodes 13 to the light emitting direction D2, so that it can reduce the interference to the image displayed in the D2 direction.

An epitaxial structure 151 of the bottom-emitting micro light emitting diode 15 has a upper surface SU2 and lower surface SL2 opposite the upper surface SU2. The lower surface SL2 faces the surface SS. The bottom-emitting micro light emitting diode 15 further has a light shielding component 153 disposed on the upper surface SU2. Similar to the light shielding layer 17, the light shielding component 153 may be an nontransparent layer, such as a blackened metal or a resin material; or the light blocking member 153 may be a reflective layer, such as a multilayer film (Bragg mirror), an organic coating, a metal, etc. The light shielding component 153 can shield or reflect the light emitted by the bottom-emitting micro light emitting diode 15 in the positive z-axis direction. Furthermore, the light emitted by the bottom-emitting micro light emitting diode 15 emits to the negative z-axis direction mostly. Therefore, the light shielding component 153 can shield the light emitted by the bottom-emitting micro light emitting diode 15 toward the light-emitting direction D1, so that it can reduce the interference to the image displayed in the D1 direction.

The top-emitting micro light emitting diodes 13 and the bottom-emitting micro light emitting diodes 15 emit light in the positive z-axis direction (light-emitting direction D1) and the negative z-axis direction (light-emitting direction D2), respectively. The transparent display panel 1 can provide the same or different images in the positive z-axis direction and the negative z-axis direction at the same time. Therefore, according to the corresponding control manner, the user can see the same or different images from the two sides of the transparent display panel 1, respectively.

It should be noted that, in the embodiment shown in FIG. 1, the bottom-emitting micro light emitting diode 15 is larger than the top-emitting micro light emitting diode 13 such that the light-emitting surface of the bottom-emitting micro light emitting diode 15 is larger than the light-emitting surface of the top-emitting micro light emitting diode 13. Since the light provided by the bottom-emitting micro light emitting diode 15 needs to pass through the light-shielding region of the light transmissive substrate 11 and the wiring layer, the light intensity thereof is affected. Thus, the area of the light-emitting surface is adjusted by adjusting the size of the bottom-emitting micro light emitting diode 15 to improve the light intensity to display the image in the light-emitting direction D2. Although this example is carried out in this way, but in general, the bottom-emitting micro light emitting diode 15 is not necessarily larger than the top-emitting micro light emitting diode 13.

Figure 3:
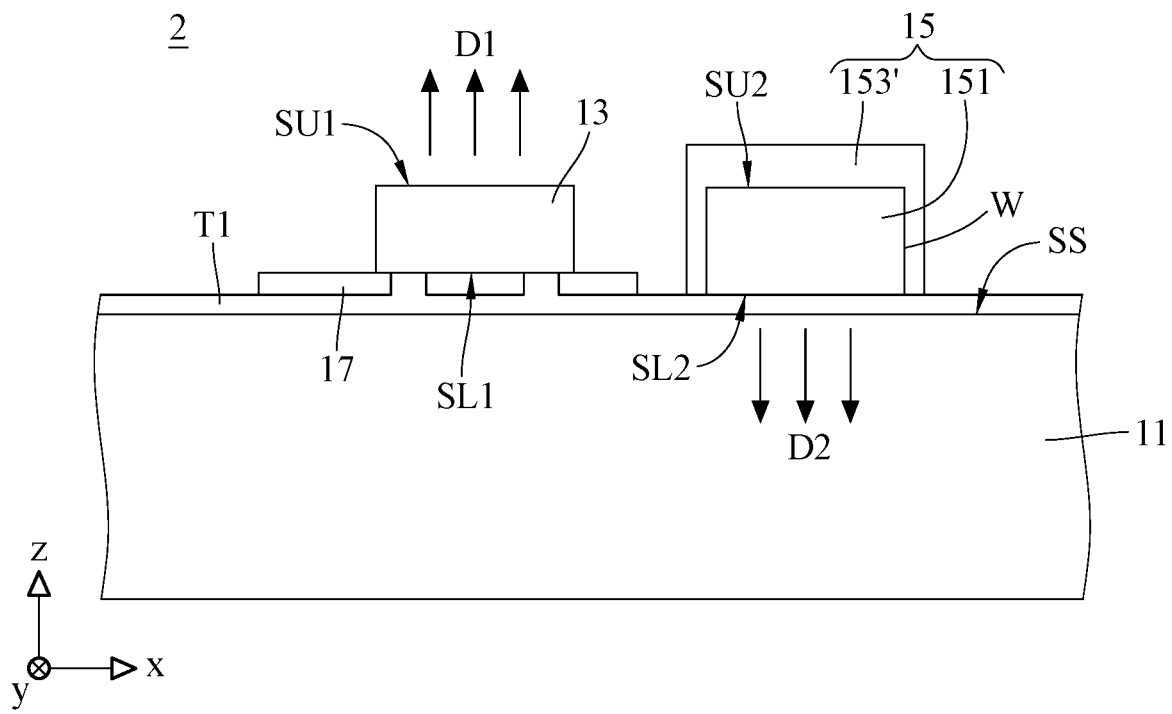
FIG. 3 is a cross-sectional view showing another embodiment of the transparent display panel illustrated in FIG. 1 according to the present disclosure.

Please refer to FIG. 3. FIG. 3 is a cross-sectional view of the transparent display panel 2 according to another embodiment of the present disclosure. With compared to FIG. 2, control wires (including T1, T2, T3, and in this section only shows T1) is formed on the surface SS of the light transmissive substrate 11 in FIG. 3, and the light shielding layer 17 is formed on the control wires. In other words, the light shielding layer 17 is disposed between the control wire T1 and the top-emitting micro light emitting diode 13. Further, the epitaxial structure 151 of the bottom-emitting micro light emitting diode 15 has a side wall W. Two ends of the side wall W are in contact with the upper surface SU2 and the lower surface SL2, respectively. The light shielding component 153' of the bottom-emitting micro light emitting diode 15 covers at least a portion of the side wall W. Thereby, the light emitted from the bottom-emitting micro light emitting diode 15 in the light-emitting direction D1 is blocked, and the display quality is improved.

Figure 4A:
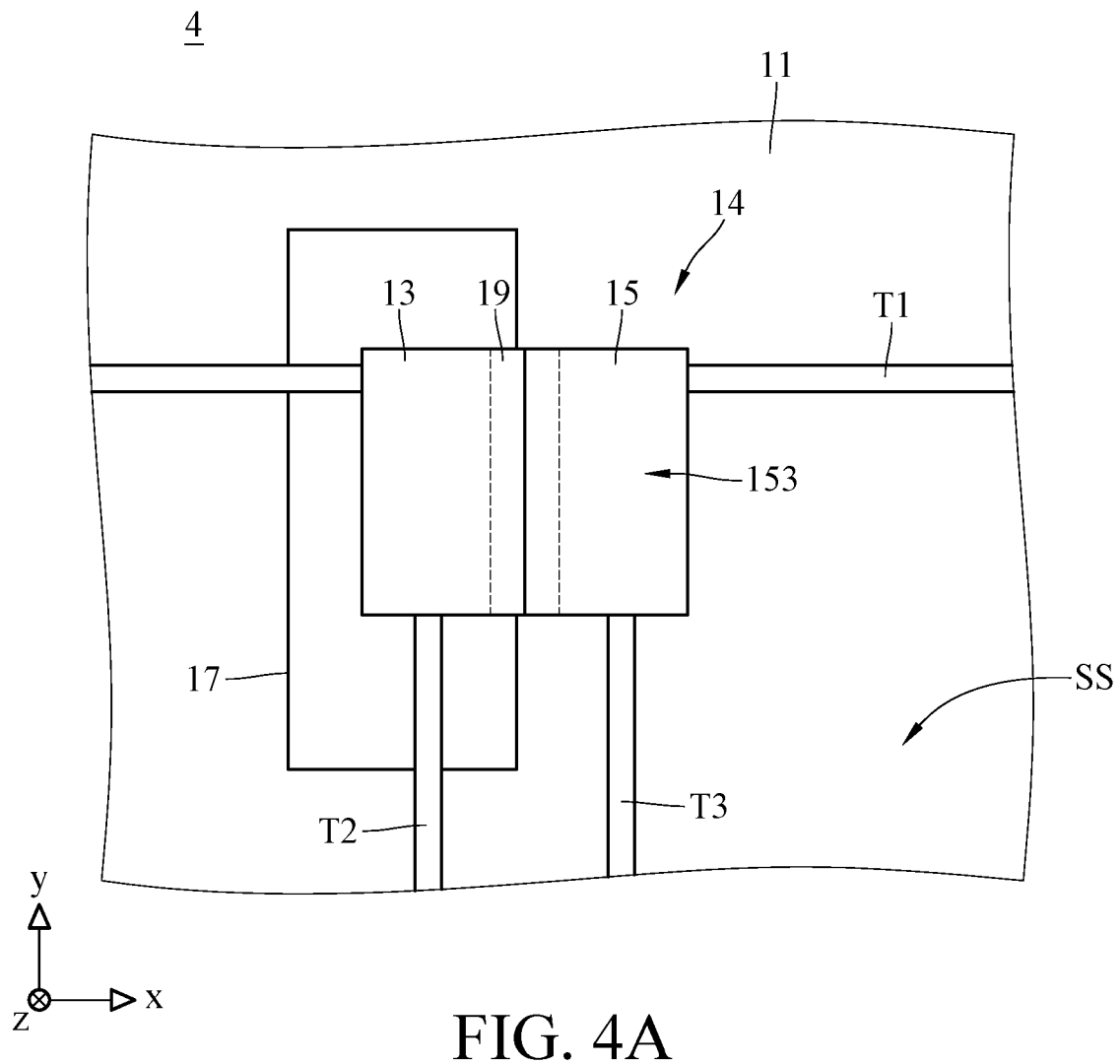
FIG. 4A is a partial top view of a transparent display panel according to an embodiment of the disclosure.
Figure 4B:
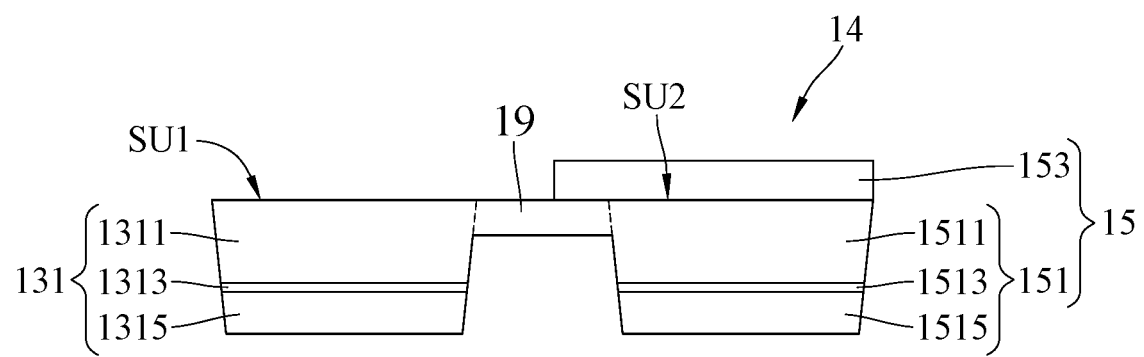
FIG. 4B is a cross-sectional view of a micro light emitting diode crystal of the transparent display panel illustrated in FIG. 4A according to the present disclosure.

Please refer to FIG. 4A and FIG. 4B, FIG. 4A is a partial top view of a transparent display panel 4 according to an embodiment of this disclosure, and FIG. 4B is a schematic view of the micro light emitting diode chip 14 of FIG. 4A according to the present disclosure. In this embodiment, one of the top-emitting micro light emitting diode 13 connects to one of the bottom-emitting micro light emitting diode 15 to form the micro light emitting diode chip 14. As shown in FIG. 4B, the epitaxial structure 151 of the bottom-emitting micro light emitting diode 15 has a I-type semiconductor layer 1511, a light-emitting layer 1513 and a II-type semiconductor layer 1515, and the light-emitting layer 1513 is located between the I-type semiconductor layer 1511 and the II-type semiconductor layer 1515. The epitaxial structure 131 of the top-emitting micro light emitting diode 13 has a I-type semiconductor layer 1311, a light-emitting layer 1313 and a II-type semiconductor layer 1315, and the light-emitting layer 1313 is located between the I-type semiconductor layer 1311 and the II-type semiconductor layer 1315. The I-type semiconductor layer 1511 of the bottom-emitting micro light emitting diode 15 is connected to the I-type semiconductor layer 1311 of the top-emitting micro light emitting diode 13 with a connection portion 19.

In practice, the material of the I-type semiconductor layer 1311 and 1511 is the same. In one embodiment, an epitaxial layer concludes the I-type semiconductor layer 1311, the connection portion 19 and the I-type semiconductor layer 1511. The light shielding component 153 is formed on I-type semiconductor layer 1511 and covers the light-emitting layer 1513, but does not cover the I-type semiconductor layer 1311 and the light-emitting layer 1313.

The I-type semiconductor layer 1311, the connection portion 19 and the I-type semiconductor layer 1511 are a N-type semiconductor, and the II-type semiconductor layer 1315 and 1515 are P-type semiconductor. In the transparent display panel 4 of the present embodiment, the top-emitting micro light emitting diode 13 and the bottom-emitting micro light emitting diode 15 are combined to form one micro light emitting diode chip 14, so that the number of the micro light emitting diode chips being transferred can be reduced by half, and the transfer process can be reduced, thereby improving the process yield.

Figure 5:
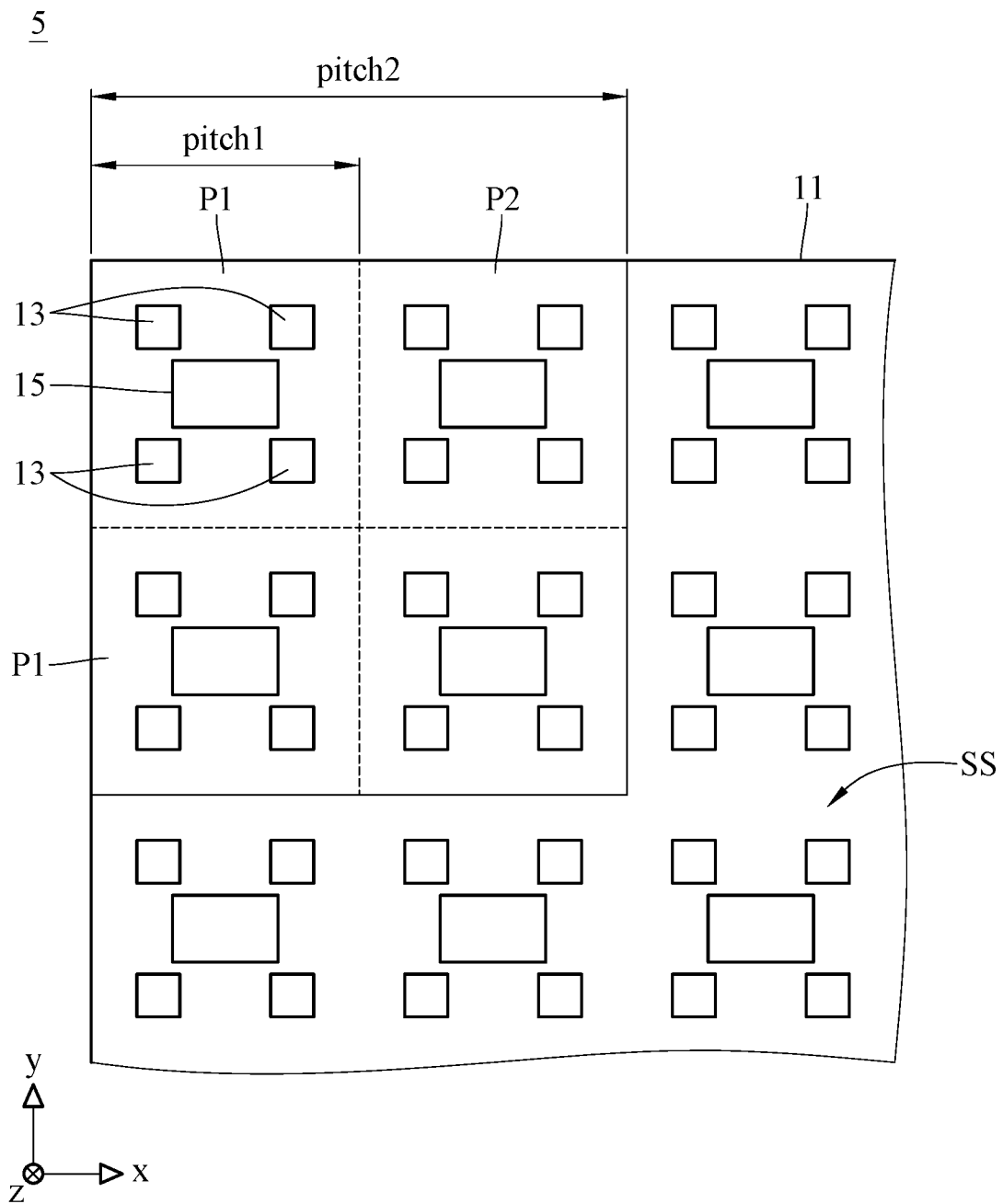
FIG. 5 is a partial top view of a transparent display panel according to an embodiment of the disclosure.

Please refer to FIG. 5. FIG. 5 is a partial top view of a transparent display panel 5 according to an embodiment of this disclosure. The transparent display panel 5 has a plurality of first pixels P1 and a plurality of second pixels P2. The top-emitting micro light emitting diode 13 is disposed on the first pixel P1, and the bottom-emitting micro light emitting diode 15 is disposed on the second pixel P2. Each of the first pixels P1 includes a plurality of top-emitting micro light emitting diodes 13 respectively used to provide light of different colors. Similarly, each second pixel P2 includes a plurality of bottom-emitting micro light emitting diodes 15 as described above and respectively used to provide light of different colors. In other words, the first pixels constitute an image displayed in the positive z-axis direction, and the second pixels constitute another image displayed in the negative z-axis direction, and the pitch of the first pixels P1 is different from the pitch of the second pixels P2. The resolution of the image displayed in the positive z-axis direction is different from the resolution of the image displayed in the negative z-axis direction.

In this embodiment, one of the first pixels P1 has four top-emitting micro light emitting diodes 13 with an arrangement of RGBY or RGBW; one of the second pixels P2 has four bottom-emitting micro light emitting diodes 15 with an arrangement of RGBY or RGBW. In addition, a second pixel P2 corresponds to four first pixels P1, that is, the resolution of the image displayed by the bottom-emitting micro light emitting diodes 15 is only a quarter of the resolution of the image displayed by the top-emitting micro light emitting diodes 13. In other words, the number of bottom-emitting micro light emitting diodes 15 is less than the number of top-emitting micro light emitting diodes 13. By reducing the number of the second pixels in one of the display directions, the transparency can be increased, and process cost can down. On the other hand, the micro light emitting diodes in each pixel are arranged in RGBY or RGBW, the light provided by each pixel may have greater brightness or better color rendering. In practice, the first pixels P1 or the second pixels P2 may also adopt an RGB configuration, which is not limited herein. A first image is shown by the first pixels P1 on one side of the light transmissive substrate 11, and a second image is shown by the second pixels P2 on another side of the light transmissive substrate 11.

Figure 6:
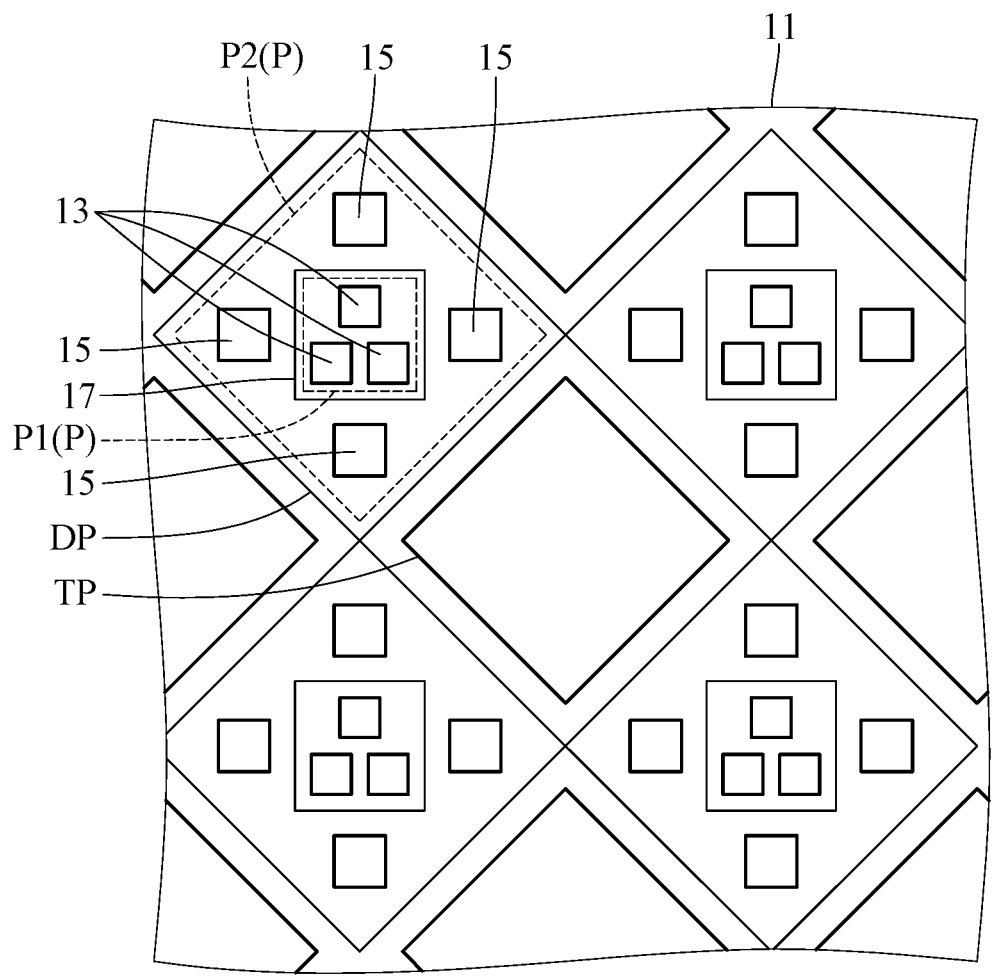
FIG. 6 is a partial top view of a transparent display panel according to another embodiment of the disclosure.

Referring to FIG. 6 again, FIG. 6 is a partial top view of the transparent display panel 6 according to another embodiment of this disclosure. In this embodiment, the transparent display panel 6 is similar to the transparent display panel 1, and the differences are as follows. The transparent display panel 6 further includes a plurality of light transmitting areas TP and a plurality of component setting areas DP. The top-emitting micro light emitting diodes 13, the bottom-emitting micro light emitting diodes 15 and most of the control wires (not shown) are disposed in the component setting areas DP, and the light transmission areas TP allows the light to pass through the light transmissive substrate 11. The transparent display panel 6 includes a plurality of pixels P disposed in component setting areas DP respectively. Each pixel P includes a first pixel P1 composed of three top-emitting micro light emitting diodes 13 and a second pixel P2 composed of four bottom-emitting micro light emitting diodes 15. The light shielding layer 17 is disposed between the top-emitting micro light emitting diodes 13 and the light transmissive substrate 11 in every first pixel P1 to shield the light emitted from the top-emitting micro light emitting diodes 13 in the direction towards the light transmissive substrate 11. The second pixel P2 may adopt an arrangement of RGBW or RGBY, so that the light provided by the second pixel P2 can improve brightness or color recognition after passing through the light transmissive substrate 11. In other embodiment, the micro light emitting diodes 13 in each first pixel P1 can be arranged in RGB, RGBW, RGBY or other feasible pixel arrangement, and is not necessarily the same as the arrangement of the second pixel, and is not limited therein. In one embodiment, one of the first pixels P1 overlaps one of the second pixels P2.

Referring to FIG. 7, FIG. 7 is a partial cross-sectional view of a transparent display panel 7 according to a further embodiment of the present disclosure. The transparent display panel 7 is similar to the transparent display panel 6 shown in FIG. 6. The main differences are as follows: The transparent display panel 7 further has a plurality of lens components 12 and a transparent insulation layer 112. The transparent insulation layer 112 is disposed on the surface SS of the light transmissive substrate 11, and the lens components 12 are disposed on the transparent insulation layer 112 and on the transparent regions TP. A light-concentrating surface Sc of the lens component 12 faces toward the surface SS of the light transmissive substrate 11. By the arrangement of the lens components 12, more light can be collected to pass through the light transmissive substrate 11 to increase the transparency of the transparent display panel 7.

Please refer to FIG. 8. FIG. 8 is a partial cross-sectional view showing a transparent display panel 8 according to a further embodiment of the present disclosure. The structure of the transparent display panel 8 is similar to that of the transparent display panel 7. The difference is that the transparent display panel 8 has a cover substrates 16 disposed on the transmissive substrate 11. The cover substrate 16 has an upper surface SU4 and a lower surface SL4 opposite to the upper surface SU4, and the lower surface SL4 faces toward the light transmissive substrate 11. The lens components 12 are disposed on the lower surface SL4 of the cover substrate 16, and the light-concentrating surfaces Sc of the lens components 12 face the surface SS of the light transmissive substrate 11. The cover substrate 16 is also made of a light-transmitting material, and can be selected from the same material as the light transmissive substrate 11.

In other embodiments, the lens component 12 can be a concave lens structure, a convex lens structure, or even a combination of different lenses, wherein the light is concentrated to increase transparency.

In summary, the present disclosure provides a transparent display panel having top-emitting micro light emitting diodes and a bottom-emitting micro light emitting diodes.

A portion of a light shielding layer is disposed between the top-emitting micro light emitting diode and a light transmissive substrate. The bottom-emitting micro light emitting diode has a light shielding component and a surface far away from the light transmissive substrate, and the light shielding component disposes on the surface. Thereby, the transparent display panel can provide a light source in different directions by the top-emitting micro light emitting diodes and the bottom-emitting micro light emitting diodes. Since the top-emitting micro light emitting diode and the bottom-emitting micro light emitting diode are disposed on the same panel, the thickness of the transparent display panel can reduce.

What is claimed is:

1. A transparent display panel comprising:
   a light transmissive substrate, with a surface;
   a plurality of top-emitting micro light emitting diodes for emitting rays upwards, disposed on the surface of the light transmissive substrate;
   a plurality of bottom-emitting micro light emitting diodes for emitting rays downwards, disposed on the surface of the light transmissive substrate, wherein each of the bottom-emitting micro light emitting diodes has an epitaxial structure and a light shielding component, the epitaxial structure has a upper surface and a lower surface, the lower surface faces the light transmissive substrate, and the light shielding component is disposed on the upper surface to shield the light emitted from the bottom-emitting micro light emitting diode towards the upper surface; and
   a light shielding layer, disposed on the surface of the light transmissive substrate, wherein a portion of the light shielding layer is disposed between the top-emitting micro light emitting diode and the light transmissive substrate to shield the light emitted from the top-emitting micro light emitting diode towards the direction of the light transmissive substrate,
   wherein the transparent display panel further has a plurality of pixels to form an image, the top-emitting micro light emitting diodes and the bottom-emitting micro light emitting diodes are arranged in the pixels.

2. The transparent display panel of claim 1, wherein an orthographic projection of the light shielding layer on the surface of the light transmissive substrate covers each of the orthographic projections of the top-emitting micro light emitting diodes on the surface of the light transmissive substrate.

3. The transparent display panel of claim 2, wherein an area of the orthographic projection of the light shielding layer on the surface of the light transmissive substrate is greater than a total area of the orthographic projections of the top-emitting micro light emitting diodes on the surface of the light transmissive substrate.

4. The transparent display panel of claim 1, wherein an orthographic projection of the light shielding layer on the surface of the light transmissive substrate does not overlap an orthographic projection of any bottom-emitting micro light emitting diode.

5. The transparent display panel of claim 1, wherein an area of an orthographic projection of bottom-emitting micro light emitting diode on the surface of the light transmissive substrate is greater than a total area of an orthographic projection of the top-emitting micro light emitting diode on the surface of the light transmissive substrate.

6. The transparent display panel of claim 1, wherein:
   the epitaxial structure of each of the bottom-emitting micro light emitting diodes further comprises a I-type semiconductor layer, a light-emitting layer and a II-type semiconductor layer, wherein the light-emitting layer is disposed between the I-type semiconductor layer and the II-type semiconductor layer;
   the epitaxial structure of each of the top-emitting micro light emitting diodes further comprises a I-type semiconductor layer, a light-emitting layer and a II-type semiconductor layer, wherein the light-emitting layer is disposed between the I-type semiconductor layer and the II-type semiconductor layer; and
   the I-type semiconductor layer of one of the top-emitting micro light emitting diodes is connected to the I-type semiconductor layer of one of the bottom-emitting micro light emitting diodes.

7. The transparent display panel of claim 1, further comprising a common electrode wire layer disposed on the surface of the light transmissive substrate, wherein:
   the epitaxial structure of each of the bottom-emitting micro light emitting diodes further comprises a I-type semiconductor layer, a light-emitting layer and a II-type semiconductor layer, wherein the light-emitting layer is disposed between the I-type semiconductor layer and the II-type semiconductor layer;

the epitaxial structure of each of the top-emitting micro light emitting diodes further comprises a I-type semiconductor layer, a light-emitting layer and a II-type semiconductor layer, wherein the light-emitting layer is disposed between the I-type semiconductor layer and the II-type semiconductor layer; and the I-type semiconductor layer of the top-micro light emitting diodes and the I-type semiconductor layer of the bottom-emitting micro light emitting diodes are electrically connected to the common electrode wiring layer.

8. The transparent display panel of claim 7, wherein, the I-type semiconductor layers of the top-emitting micro light emitting diodes are adjacent to the surface of the light transmissive substrate and the common electrode wiring layer, and the I-type semiconductor layers of the bottom-emitting micro light emitting diodes are adjacent to the surface of the light transmissive substrate and the common electrode wiring layer.

9. The transparent display panel of claim 7, wherein, the I-type semiconductor layers of the top-emitting micro light emitting diodes are adjacent to the surface of the light transmissive substrate, and the II-type semiconductor layers of the bottom-emitting micro light emitting diodes are adjacent to the surface of the light transmissive substrate.

10. The transparent display panel of claim 1, the plurality of pixels comprising:

a plurality of first pixels, arranged in an array, with each of the first pixels comprising at least two of the top-emitting micro light emitting diodes, wherein the at least two top-emitting micro light emitting diodes are configured to provide different color of light respectively; and a plurality of second pixels, arranged in an array, with each of the second pixels comprising at least two of the bottom-emitting micro light emitting diodes, wherein the at least two bottom-emitting micro light emitting diodes are configured to provide different color of light respectively;

a pitch of the first pixels arrangement is different from a pitch of the second pixels arrangement.

11. The transparent display panel of claim 10, wherein the image is a first image shown by the first pixels on one side of the light transmissive substrate, and a second image is shown by the second pixels on another side of the light transmissive substrate.

12. The transparent display panel of claim 11, wherein the number of the first pixels is different from the number of the second pixels.

13. The transparent display panel of claim 11, wherein one of the first pixels overlaps one of the second pixels.

14. The transparent display panel of claim 1, wherein the top-emitting micro light emitting diodes surround one of the bottom-emitting micro light emitting diodes.

15. The transparent display panel of claim 7, wherein a portion of the common electrode wiring layer is covered by the light shielding layer.

16. The transparent display panel of claim 1, wherein the epitaxial structure of each of the bottom-emitting micro light emitting diodes further comprises a side wall that is connected to the upper surface and is not parallel to the upper surface, the light shielding component extends from the upper surface and covers at least a portion of the side wall.

17. The transparent display panel of claim 1, further comprises a lens component and a transparent insulation layer, the transparent insulation layer is disposed on light transmissive substrate, wherein the lens component is disposed on the transparent insulation layer, and a light-concentrating surface of the lens component faces the surface of the light transmissive substrate.

18. The transparent display panel of claim 1, further comprises a lens component and a cover substrate, wherein the lens component is disposed on the cover substrate, and the lens component comprises a light-concentrating surface facing the surface of the light transmissive substrate.

* * * * *